(12) United States Patent
Tomari et al.

(10) Patent No.: US 6,900,688 B2
(45) Date of Patent: May 31, 2005

(54) SWITCH CIRCUIT (75) Inventors: Nobuhiro Tomari, Miyazaki (JP); Kouji Hirayama, Miyazaki (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/672,277

(22) Filed: Sep. 26, 2003

(65) Prior Publication Data

US 2004/0095182 A1 May 20, 2004

Related U.S. Application Data (60) Provisional application No. 60/413,782, filed on Sep. 27, 2002.

(51) Int. Cl.$^7$ ................................................. H03K 3/01
(52) U.S. Cl. ......................... 327/534; 327/536; 324/736
(58) Field of Search .................. 327/534, 536, 327/389, 391, 407, 408, 415, 416, 221, 417; 324/763, 736

(56) References Cited

U.S. PATENT DOCUMENTS

| | | | | |
|---|---|---|---|---|
| 5,597,191 A | * | 1/1997 | McPhee et al. | 294/82.14 |
| 6,194,952 B1 | * | 2/2001 | Shigehara | 327/534 |
| 6,429,723 B1 | * | 8/2002 | Hastings | 327/536 |
| 6,566,927 B2 | * | 5/2003 | Park et al. | 327/211 |
| 6,639,855 B2 | * | 10/2003 | Furumochi | 365/200 |
| 6,661,278 B1 | * | 12/2003 | Gilliland | 327/536 |

FOREIGN PATENT DOCUMENTS

JP  05-218840  8/1993

* cited by examiner

Primary Examiner—Timothy P. Callahan
Assistant Examiner—Hiep Nguyen
(74) Attorney, Agent, or Firm—Volentine Francos & Whitt, PLLC (57) ABSTRACT A switch circuit includes an input terminal, an internal circuit, and first and second MOS transistors. The input terminal receives an input signal. The internal circuit executes a predetermined function. The first MOS transistor is a first conductivity type MOS transistor. The first MOS transistor is coupled between the input terminal and the internal circuit, and has a control gate receiving a control signal, a first electrode coupled to the input terminal and a second electrode. The second MOS transistor is a second conductivity type MOS transistor of a type opposite the first conductivity type MOS transistor. The second MOS transistor is coupled between the input terminal and the internal circuit, and has a control gate receiving a signal having a phase opposite the control signal, a first electrode coupled to the second electrode of the first MOS transistor and a second electrode coupled to the internal circuit.

16 Claims, 9 Drawing Sheets

SWITCH CIRCUIT

This application claims priority under 35 USC §119 (e)(1) of provisional application No. 60/413,782 filed Sep. 27, 2002.

BACKGROUND OF THE INVENTION

1. Field of the Invention

The present invention relates to a switch circuit.

2. Description of the Related Art

In an integrated circuit having a plurality of internal circuits connected to one input terminal provided with a plurality of functions, a switch circuit has been generally provided between one input terminal and a plurality of internal circuits. The switch circuit is subjected to in on-off control in response to a control signal. An input signal supplied to an input terminal is selectively transmitted to each internal circuit by the switch circuit.

However, in the case where a noise such as an overshoot or an undershoot is generated in the input signal to be supplied to the input terminal, the conventional switch circuit has no configuration to prevent the noise from being transmitted to each internal circuit, and hence it was necessary to prevent the noise from being transmitted to each internal circuit. Particularly, if each internal circuit is susceptible to the noise of the signal inputted to the input terminal, it was necessary to prevent the noise generated in the input signal to be supplied to the input terminal from being transmitted to each internal circuit.

SUMMARY OF THE INVENTION

According to one aspect of the present invention, there is provided a switch circuit that includes an input terminal which receives an input signal and an internal circuit which executes a predetermined function. The switch circuit also includes a first switch element which is coupled between the input terminal and the internal circuit and which has a control gate receiving a control signal, a first electrode coupled to the input terminal, and a second electrode. The switch circuit also includes a second switch element which is coupled between the input terminal and the internal circuit and which has a control gate receiving the control signal, a first electrode coupled to the second electrode of the first switch element, and a second electrode coupled to the internal circuit.

The above novel features of the invention will more fully appear from the following detailed description, appended claims and the accompanying drawings.

DETAILED DESCRIPTION OF THE PREFERRED EMBODIMENTS

A switch circuit according to preferred embodiments of the present invention will be explained hereinafter with reference to figures. In order to simplify explanation, like elements are given like or corresponding reference numerals through this specification and figures. Dual explanations of the same elements are avoided.

First Preferred Embodiment

Figure 1:
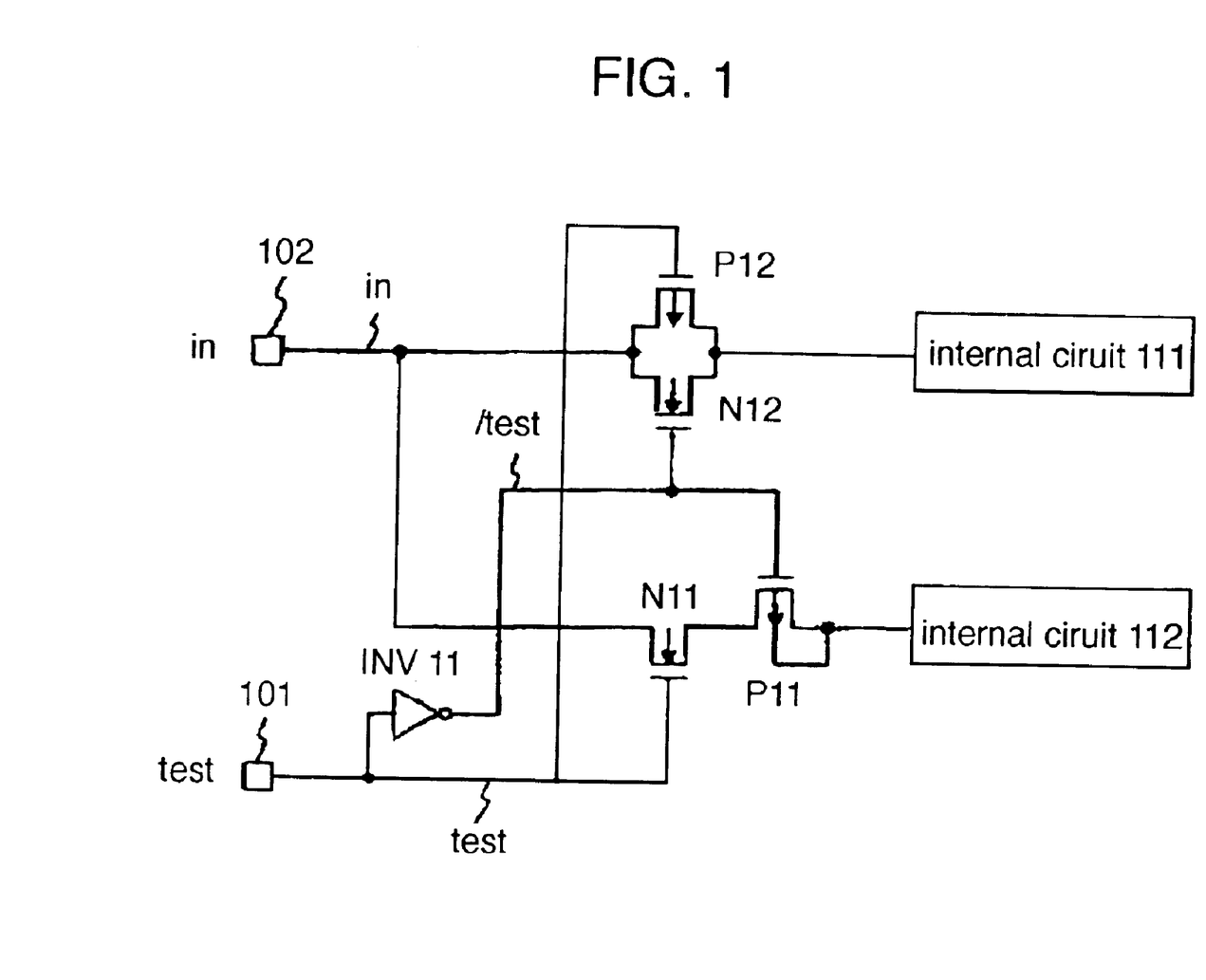
FIG. 1 is a circuit diagram showing a configuration of a switch circuit according to a first embodiment of the invention.

A switch circuit of a first embodiment of the invention is described. FIG. 1 is a circuit diagram showing a configuration of the switch circuit according to the first embodiment of the invention. The switch circuit of the first embodiment comprises an n-channel MOS transistor (hereinafter referred to as NMOS transistor) N11 which operates in response to a test control signal test, an inverter circuit INV11 for outputting a signal having a phase opposite to the test control signal test (hereinafter referred to as signal /test) in response to the test control signal test, a p-channel MOS transistor (hereinafter referred to as PMOS transistor) P11 which operates in response to the signal /test, an NMOS transistor N12 which operates in response to the signal /test, and a PMOS transistor P12 which operates in response to the test control signal test. The signal and a wiring for transmitting the signal is depicted by the same reference numeral.

A control electrode (gate) of the NMOS transistor N11 is connected to a test terminal 101 via a signal line test, and a first electrode thereof is connected to an input terminal 102 via an input signal line in and a second electrode is connected to the PMOS transistor P11. The test control signal test is supplied from an external device to the test terminal 101. The input signal in is supplied from the external device to the input terminal 102. The input signal in is the signal having an amplitude ranging from a ground voltage GND to a power supply voltage VDD. The input terminal 102 is used as a signal input terminal when testing the switch circuit as well as a normal terminal. According to an integrated circuit (e.g., a microcontroller of an IC card, and so forth) which is limited in the number of terminal, it is necessary that one input terminal may have a plurality of functions. An input terminal of the inverter circuit INV11 is connected to the test terminal 101 via a test signal line test while an output terminal thereof is connected to the PMOS transistor P11 and the NMOS transistor N12 via a signal line /test. A gate of the PMOS transistor P11 is connected to the inverter circuit INV11 via the signal line /test, a first electrode thereof is connected to the second electrode of the NMOS transistor N11 and a second electrode thereof is connected to an internal circuit 112. A substrate of the PMOS transistor P11 is connected to the second electrode thereof The internal circuit 112 is a circuit which is susceptible to a noise generated in a signal to be inputted thereto, e.g., an analog circuit. The internal circuit 112 is a circuit to be connected to the input terminal 102 only when testing the switch circuit.

A gate of the NMOS transistor N12 is connected to an output terminal of the inverter circuit INV11, and a first electrode thereof is connected to the input terminal 102 via the input signal line in, and a second electrode thereof is connected to an internal circuit 111. A gate of the PMOS transistor P12 is connected to the test terminal 101 via the test signal line test, a first electrode thereof is connected to the input terminal 102 via the input signal line in and a second electrode thereof is connected to the internal circuit 111. The first electrode of the NMOS transistor N12 and the first electrode of the PMOS transistor P12 are connected in common to each other. The second electrode of the NMOS transistor N12 and the second electrode of the PMOS transistor P12 are connected in common to each other. The internal circuit 111 is a circuit which is hardly susceptible to the noise generated in the signal to be inputted thereto, e.g., a digital circuit.

Figure 2:
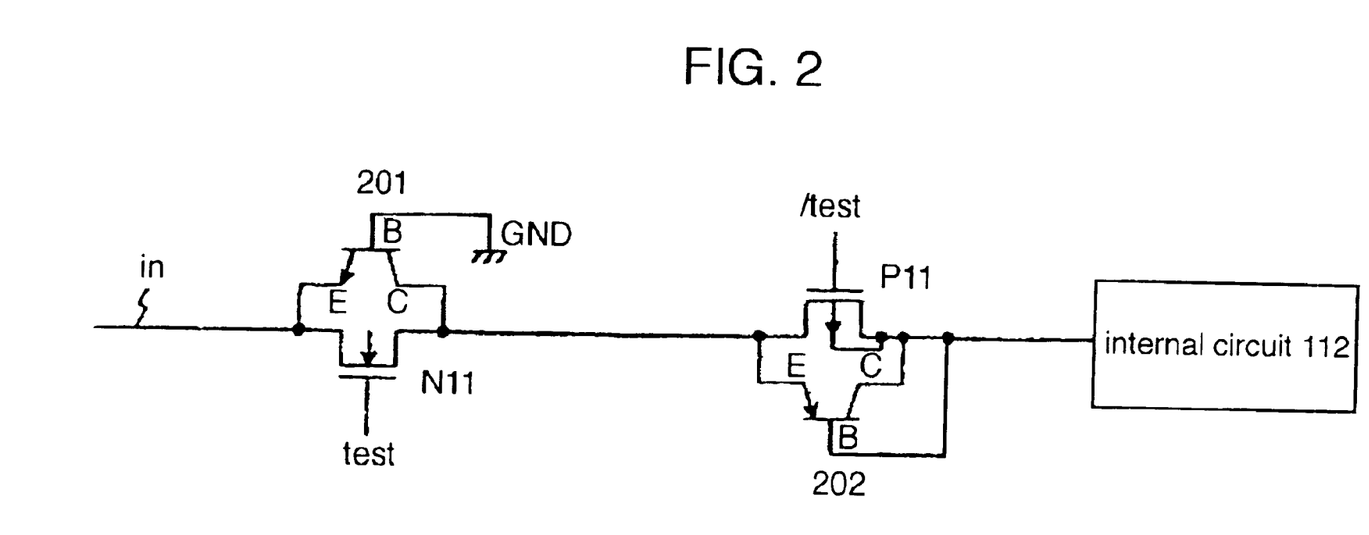
FIG. 2 is a circuit diagram showing a configuration of a parasitic bipolar transistor of an NMOS transistor N11 and a parasitic bipolar transistor of a PMOS transistor P11.

Described next with reference to FIG. 2 is a parasitic bipolar transistor of the NMOS transistor N11 and a parasitic bipolar transistor of the PMOS transistor P11. FIG. 2 is a circuit diagram showing a configuration of the parasitic bipolar transistor of the NMOS transistor N11 and the parasitic bipolar transistor of the PMOS transistor P11. An npn-type parasitic bipolar transistor 201 is formed in the NMOS transistor N11. A base (depicted by B in FIG. 2) of the parasitic bipolar transistor 201 is connected to a ground node. A ground voltage GND is supplied to the ground node. An emitter (depicted by E in FIG. 2) of the parasitic bipolar transistor 201 is connected to the first electrode of the NMOS transistor N11, and a collector (depicted by C in FIG. 2) thereof is connected to the second electrode of the NMOS transistor N11. A pnp-type parasitic bipolar transistor 202 is formed in the PMOS transistor P11. A base (depicted by B in FIG. 2) of the parasitic bipolar transistor 202 is connected to the second electrode of the PMOS transistor P11, an emitter (depicted by E in FIG. 2) thereof is connected to the first electrode of the PMOS transistor P11, and a collector (depicted by C in FIG. 2) thereof is connected to the second electrode of the PMOS transistor P11.

An operation of the switch circuit of the first embodiment is described next. There are a normal mode operation and a test mode operation in the operation of the switch circuit. The test control signal test goes low level (hereinafter referred to "L") during the normal mode operation and high level (hereinafter referred to "H") during the test mode operation. The "L" is a level of ground voltage GND and the "H" is a level of the power supply voltage VDD.

The normal mode operation is first described. The PMOS transistor P12 turns ON in response to the test control signal test of "L". The NMOS transistor N12 turns ON in response to the signal /test of "H". In such a manner, the input terminal 102 and the internal circuit 111 are forced into conduction. The NMOS transistor N11 turns OFF in response to the test control signal test of "L". The PMOS transistor P11 turns OFF in response to the signal line /test of "H". In such a manner, the connection between the input terminal 102 and the internal circuit 112 is interrupted.

Described next is an operation in the case where there occurs an overshoot in the input signal in during the normal mode operation, thereby rendering the input signal higher than the power supply voltage VDD. The NMOS transistor N12 and the PMOS transistor P12 turn ON respectively, so that the input terminal in of the internal circuit 111 are forced into conduction. Since the internal circuit 111 is a circuit which is hardly susceptible to a noise, even if a signal in which there occurred the overshoot is inputted thereto, the internal circuit 111 operates normally. The ground voltage GND is supplied to the gate of the NMOS transistor N11 and a voltage which is higher than the power supply voltage VDD is supplied to the first electrode of the NMOS transistor N11 and hence the NMOS transistor N11 turns OFF. The ground voltage GND is supplied to the base of the parasitic bipolar transistor 201, and a voltage higher than the power supply voltage VDD is supplied to the emitter thereof. Since the voltage to be supplied to the base of the parasitic bipolar transistor 201 is lower than the voltage supplied to the emitter thereof the parasitic bipolar transistor 201 turns OFF. Since the NMOS transistor N11 and the parasitic bipolar transistor 201 turn OFF, the connection between the input terminal 102 and the internal circuit 112 is interrupted.

Described next is an operation in the case where there occurs an undershoot in the input signal in during the normal mode operation, thereby rendering the input signal in lower than the ground voltage GND. The NMOS transistor N12 and the PMOS transistor P12 turn ON respectively, so that the input terminal in and the internal circuit 111 are forced into conduction. Since the internal circuit 111 is a circuit which is hardly susceptible to a noise, even if a signal in which there occurred the undershoot is inputted thereto, the internal circuit 111 operates normally. Since the power supply voltage VDD is supplied to the gate of the PMOS transistor P11, the PMOS transistor P11 turns OFF The voltage is supplied to the emitter of the parasitic bipolar transistor 202 is lower than that supplied to the base, the parasitic bipolar transistor 202 turns OFF. Since the PMOS transistor P11 and the parasitic bipolar transistor 202 turn OFF, the connection between the input terminal 102 and the internal circuit 112 is interrupted.

The test mode operation is described next. The PMOS transistor P12 turns OFF in response to the test control signal test of "H". The NMOS transistor N12 turns OFF in response to the signal /test of "L". In such a manner, the connection between the input terminal 102 and the internal circuit 111 are interrupted. The NMOS transistor N11 turns ON in response to the test control signal test of "H". The PMOS transistor P11 turns ON in response to the signal /test of "L". In such a manner, the input terminal 102 and the internal circuit 112 are forced into conduction. The connection between the input terminal 102 and the internal circuit 111 is interrupted while the input terminal 102 and the internal circuit 112 are forced into conduction, so that the input signal in is transmitted to the internal circuit 112.

Described next is an operation in the case where there occurs an overshoot in the input signal in during the test mode operation. Since the power supply voltage VDD is supplied to the gate of the NMOS transistor N11 and a voltage which is higher than the power supply voltage VDD is supplied to the first electrode thereof the voltage of the second electrode of the N-MOS transistor N11 becomes "the power supply voltage VDD−Vtn", where Vtn is a threshold voltage of the NMOS transistor N11. A signal of "the power supply voltage VDD−Vtn" is transmitted to the internal circuit 112, and a signal having a voltage which is higher than the power supply voltage VDD is not transmitted to the internal circuit 112.

Described next is an operation in the case where there occurs an undershoot in the input signal in during the test mode operation. Since the ground voltage GND is supplied to the gate of the PMOS transistor P11 and a voltage which is lower than the ground voltage GND is supplied to the first electrode thereof, the voltage of the second electrode of the PMOS transistor P11 becomes "Vtp", where Vtp is a threshold voltage of the PMOS transistor P11. The signal of Vtp is transmitted to the internal circuit 112 and a signal having a voltage which is lower than the ground voltage GND is not supplied to the internal circuit 112.

As mentioned above, since the switch circuit of the first embodiment comprises the NMOS transistor N11 (first switch element) and the PMOS transistor P11 (second switch element), which are serially connected between the input terminal 102 and the internal circuit 112, and operate in response to the test control signal test respectively, so that even if there occurred the overshoot or the undershoot in the input signal in to be supplied to the input terminal 102, it is possible to prevent a signal having a voltage which is higher than the power supply voltage VDD or a signal having a voltage which is lower than the ground voltage GND from being transmitted to the internal circuit 112. The switch circuit of the first embodiment can prevent the internal circuit 112 from being susceptible to a noise generated in the input signal in.

Second Preferred Embodiment

Figure 3:
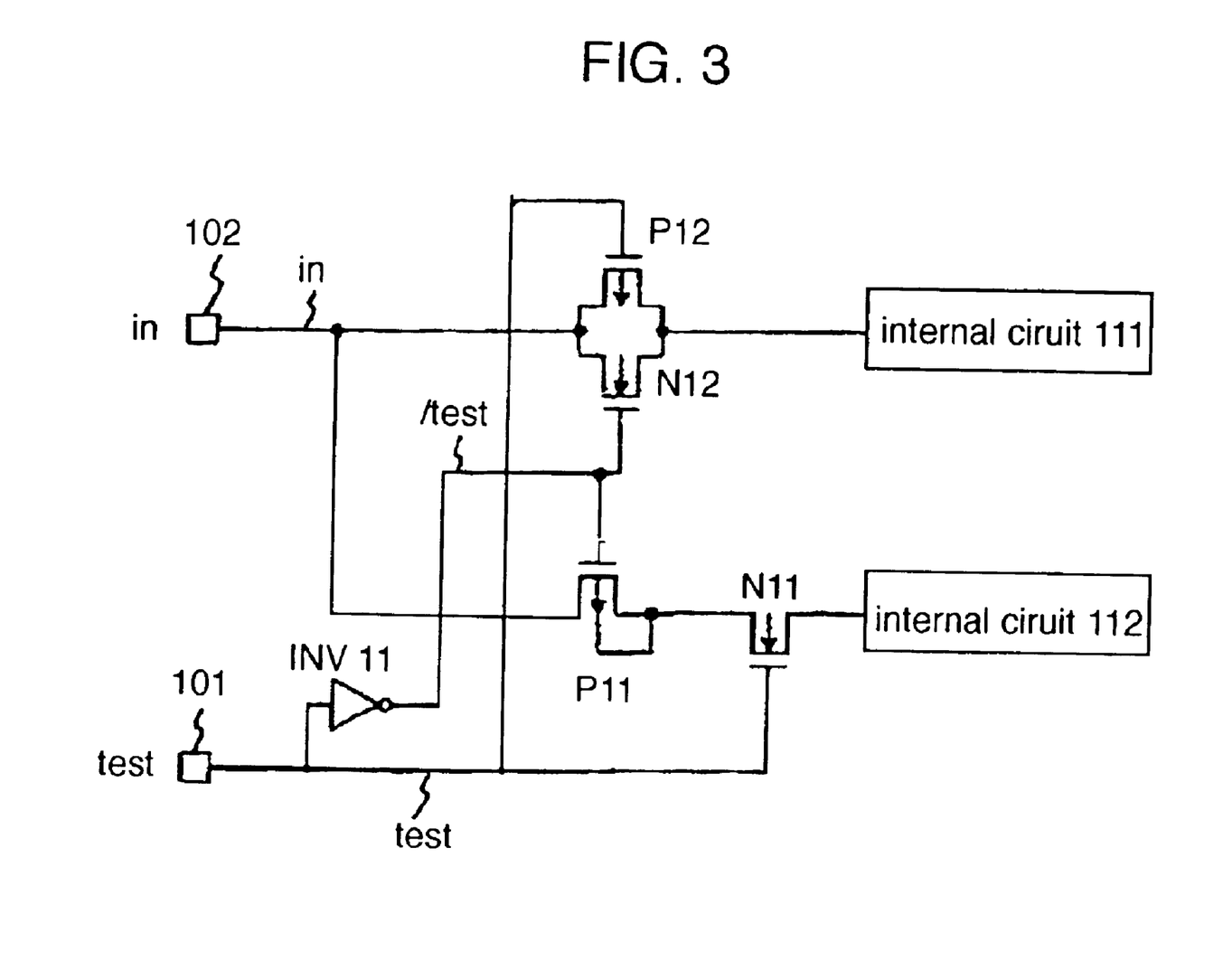
FIG. 3 is a circuit diagram showing a configuration of a switch circuit according to a second embodiment of the invention.

A switch circuit of a second embodiment of the invention is described. FIG. 3 is a circuit diagram showing a configuration of the switch circuit according to the second embodiment of the invention. The switch circuit of the second embodiment is different from that of the first embodiment shown in FIG. 1 in respect of a positional relationship between a PMOS transistor P11 and an NMOS transistor N11, and the other components of the second embodiment are the same as those of the first embodiment. A control electrode (gate) of the PMOS transistor P11 is connected to an output terminal of an inverter circuit INV11 via a signal line /test, a first electrode thereof is connected to an input terminal 102 via an input signal line in, and a second electrode thereof is connected to the NMOS transistor N11. A substrate of the PMOS transistor P11 is connected to the second electrode thereof A control electrode (gate) of the NMOS transistor N11 is connected to a test terminal 101 via a test signal line test, a first electrode thereof is connected to the second electrode of the PMOS transistor P11, and the second electrode thereof is connected to an internal circuit 112.

Figure 4:
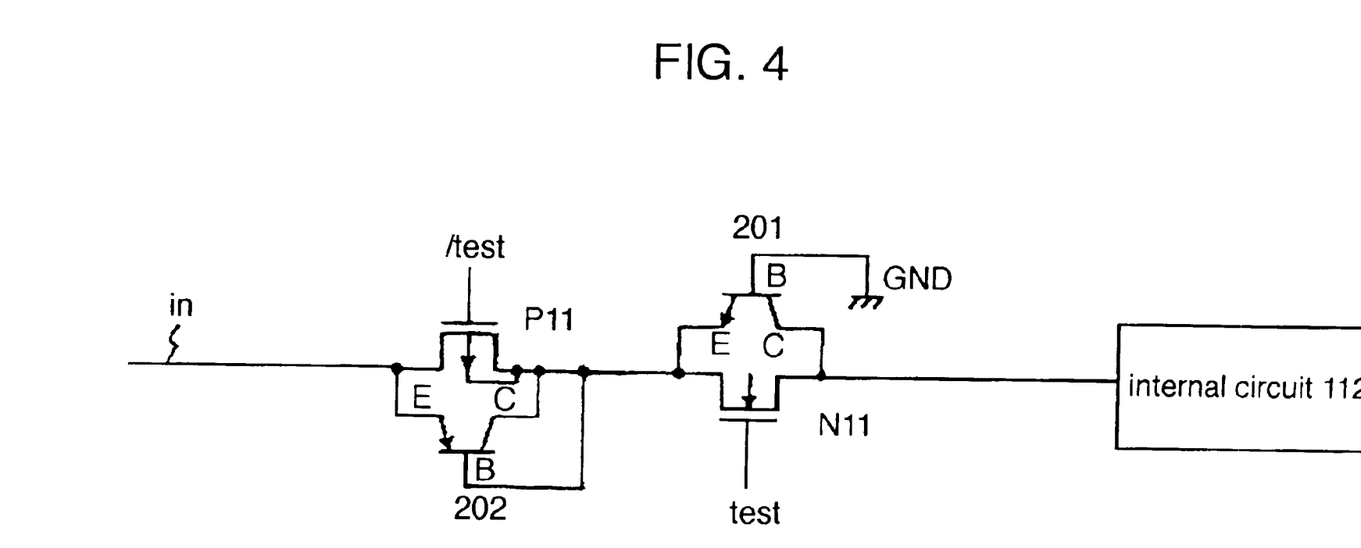
FIG. 4 is a circuit diagram showing a configuration of a parasitic bipolar transistor of a PMOS transistor P11 and a parasitic bipolar transistor of an NMOS transistor N11.

Described next with reference to FIG. 4 is a parasitic transistor of the PMOS transistor P11 and a parasitic transistor of the NMOS transistor N11. FIG. 4 is a circuit diagram showing configurations of a parasitic bipolar transistor of the PMOS transistor P11 and the parasitic bipolar transistor of the NMOS transistor N11. A pnp-type parasitic bipolar transistor 202 is formed in the PMOS transistor P11. A base (depicted by B in FIG. 4) of the parasitic bipolar transistor 202 is connected to the second electrode of the PMOS transistor P11, an emitter (depicted by E in FIG. 4) thereof is connected to the first electrode of the PMOS transistor P11 and a collector (depicted by C in FIG. 4) thereof is connected to the second electrode of the PMOS transistor P11. An npn-type parasitic bipolar transistor 201 is formed in the NMOS transistor N11. A base (depicted by B in FIG. 4) of the parasitic bipolar transistor 201 is connected to a ground node to which a ground voltage GND is supplied, an emitter (depicted by E in FIG. 4) thereof is connected to the first electrode of the NMOS transistor N11 and a collector (depicted by C in FIG. 4) thereof is connected to the second electrode of the NMOS transistor N11.

An operation of the switch circuit of the second embodiment is described next. Described next is an operation in the case where there occurs an overshoot in the input signal in during a normal mode operation, and an operation in the case where there occurs an undershoot in the input signal in during the normal mode operation.

Described first is the operation in the case where there occurs the overshoot in the input signal in during the normal mode operation, thereby rendering the input signal in higher than the power supply voltage VDD. The NMOS transistor N12 and the PMOS transistor P12 turn ON respectively, so that the input terminal in and an internal circuit 111 are forced into conduction. Since the internal circuit 111 is a circuit which is hardly susceptible to a noise, even if a signal in which there occurred the overshoot is inputted thereto, the internal circuit 111 operates normally. Since the ground voltage GND is supplied to the gate of the NMOS transistor N11 and the voltage higher than the power supply voltage VDD is supplied to the first electrode thereof the NMOS transistor N11 turns OFF. The ground voltage GND is supplied to the base of the parasitic bipolar transistor 201, and a voltage which is higher than the power supply voltage VDD is supplied to the emitter thereof. Since the voltage supplied to the base of the parasitic bipolar transistor 201 is lower than the voltage supplied to the emitter thereof the parasitic bipolar transistor 201 turns OFF Since the NMOS transistor N11 and the parasitic bipolar transistor 201 turn OFF, the connection between the input terminal 102 and the internal circuit 112 is interrupted.

Described next is the operation in the case where there occurs the undershoot in the input signal in during the normal mode operation and the input signal in becomes lower than the ground voltage GND. The NMOS transistor N12 and the PMOS transistor P12 turn ON, and the input signal in and the internal circuit 111 are forced into conduction. Since the internal circuit 111 is a circuit which is hardly susceptible to the noise, even if a signal in which there occurred the undershoot is inputted thereto, the internal circuit 111 operates normally. Since the power supply voltage VDD is supplied to the gate of the PMOS transistor P11, the PMOS transistor P11 turns OFF Since the voltage supplied to the emitter of the parasitic bipolar transistor 202 is lower than the voltage supplied to the base thereof, the parasitic bipolar transistor 202 turns OFF. Since the PMOS transistor P11 and the parasitic bipolar transistor 202 turn OFF, the connection between the input terminal 102 and the internal circuit 112 is interrupted.

Described next is the operation in the case where there occurs the overshoot in the input signal in during the test mode operation. Since the power supply voltage VDD is supplied to the gate of the NMOS transistor N11 and a voltage higher than the power supply voltage VDD is supplied to the first electrode, the voltage of the second electrode of the NMOS transistor N11 becomes "the power supply voltage VDD−Vtn", where Vtn is a threshold voltage of the NMOS transistor N11. A signal of "the power supply voltage VDD−Vtn" is transmitted to the internal circuit 112, and a signal having a voltage which is higher than the power supply voltage VDD is not transmitted to the internal circuit 112.

Described next is the operation in the case where there occurs the undershoot in the input signal in during the test mode operation. Since the ground voltage GND is supplied to the gate of the PMOS transistor P11 and a voltage which is lower than the ground voltage GND is supplied to the first electrode thereof, the voltage of the second electrode of the PMOS transistor P11 becomes "Vtp", where Vtp is a threshold voltage of the PMOS transistor P11. The signal of "Vtp" is transmitted to the internal circuit 112 and a signal having a voltage which is lower than the ground voltage GND is not supplied to the internal circuit 112.

As mentioned above, since the switch circuit of the second embodiment comprises the PMOS transistor P11 (second switch element) and the NMOS transistor N11 (first switch element), which are serially connected between the input terminal 102 and the internal circuit 112, and operate in response to the test control signal test respectively, so that even if there occurred the overshoot or the undershoot in the input signal in to be supplied to the input terminal 102, it is possible to prevent a signal which is higher than the power supply voltage VDD or a signal which is lower than the ground voltage GND from being transmitted to the internal circuit 112. The switch circuit of the second embodiment can prevent the internal circuit 112 from being susceptible to a noise generated in the input signal in.

Third Preferred Embodiment

Figure 5:
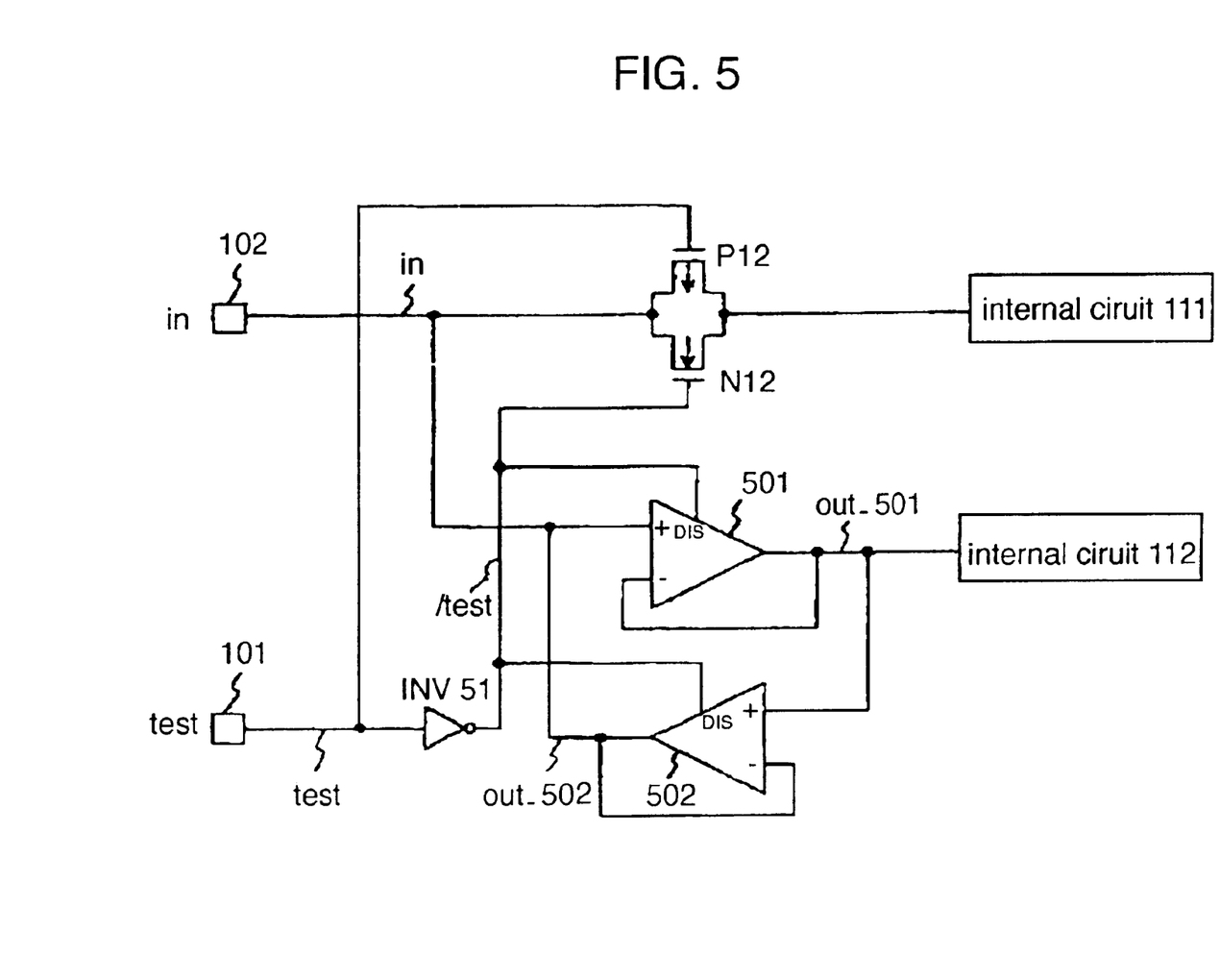
FIG. 5 is a circuit diagram showing a configuration of a switch circuit according to a third embodiment of the invention.

A switch circuit of a third embodiment of the invention is described. FIG. 5 is a circuit diagram showing a configuration of the switch circuit according to the third embodiment of the invention. The switch circuit of the third embodiment comprises an inverter circuit INV51 for outputting a signal /test having a phase opposite to that of a test control signal test in response to the test control signal test, an operational amplifier 501 which is controlled in an operative condition in response to the signal /test and outputs a signal out_501 in response to an input signal in, an operational amplifier 502 which is controlled in an operative condition in response to the signal /test and outputs an output signal out_502 in response to the output signal out_501, a PMOS transistor P12 which operates in response to the test control signal test, and an NMOS transistor N12 which operates in response to the signal /test. The signal and a wiring for transmitting the signal are depicted by the same reference numeral.

An input terminal of the inverter circuit INV51 is connected to a test terminal 101 via test control signal line test, and an output terminal thereof is connected to the operational amplifiers 501 and 502, and the NMOS transistor N12. A noninverting input terminal (+terminal) of the operational amplifier 501 is connected to an input terminal 102 via the input signal in, and an inverting input terminal (−terminal) and an output terminal thereof are connected in common to each other, and a common connection node thereof is connected to an internal circuit 112, and a control terminal DIS thereof is connected to an output terminal of the inverter circuit INV51 via the signal line /test. The internal circuit 112 is a circuit which is susceptible to a noise generated in a signal to be inputted thereto, e.g., an analog circuit. The noninverting input terminal (+terminal) of the operational amplifier 502 is connected to the output terminal of the operational amplifier 501, and an inverting input terminal (−terminal) and an output terminal thereof are connected in common to each other, and a control terminal DIS thereof is connected to the output terminal of the inverter circuit INV51.

A gate of the NMOS transistor N12 is connected to the output terminal of the inverter circuit INV51 via the signal line /test, and a first electrode thereof is connected to the input terminal 102 via the input signal line in and a second electrode thereof is connected to an internal circuit 111. A gate of the PMOS transistor P12 is connected to the test terminal 101 via the test signal line test, a first electrode thereof is connected to the input terminal 102 via the input signal line in and a second electrode thereof is connected to the internal circuit 111. The first electrode of the NMOS transistor N12 and the first electrode of the PMOS transistor P12 are connected in common to each other. The second electrode of the NMOS transistor N12 and the second electrode of the PMOS transistor P12 are connected in common to each other. The internal circuit 111 is a circuit which is hardly susceptible to the noise generated in the signal to be inputted, e.g., a digital circuit.

Figure 6:
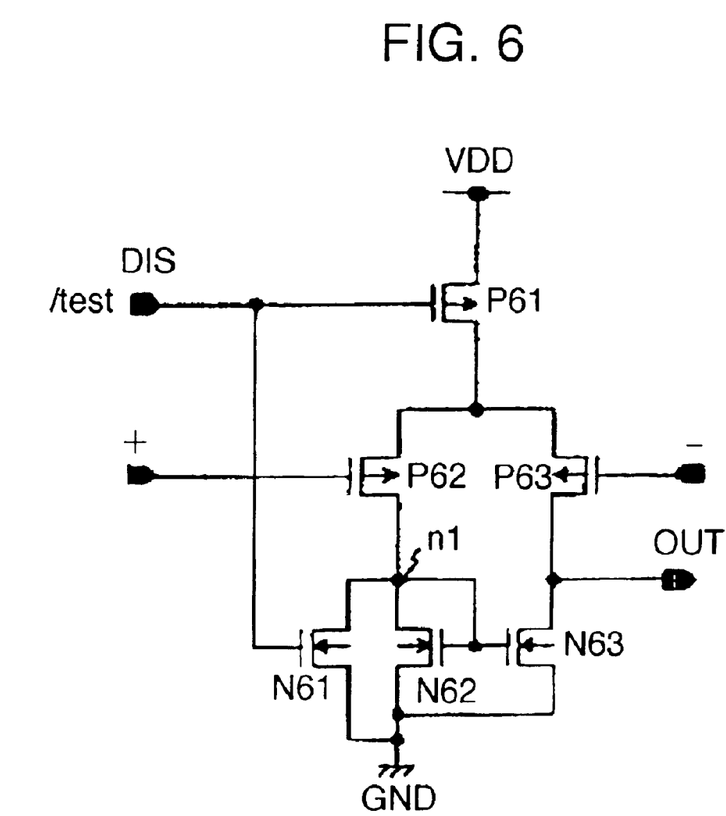
FIG. 6 is a circuit diagram showing a configuration of operational amplifiers 501 and 502.

Described next with reference to FIG. 6 is detailed configurations of the operational amplifiers 501 and 502. FIG. 6 is a circuit diagram showing each configuration of the operational amplifiers 501 and 502. Meanwhile, the operational amplifiers 501 and 502 have the same configuration. The operational amplifiers 501 and 502 each comprises a PMOS transistor P61 which operates in response to the signal /test, a PMOS transistor P62 which operates in response to a signal inputted to the noninverting input terminal (+terminal), a PMOS transistor P63 which operates in response to a signal inputted to the inverting input terminal (−terminal), an NMOS transistor N61 which operates in response to the signal /test, and NMOS transistors N62 and N63 constituting a current mirror circuit. A gate (control electrode) of the PMOS transistor P61 is connected to the control terminal DIS, a source (first electrode) thereof is connected to a power supply node to which the power supply voltage VDD is supplied, a drain (second electrode) thereof is connected to the PMOS transistors P62 and P63. A gate (control electrode) of the PMOS transistor P62 is connected to the noninverting input terminal (+terminal), a source (first electrode) thereof is connected to the drain of the PMOS transistor P61, a drain (second electrode) thereof is connected to the NMOS transistors N61, N62 and N63. A gate (control electrode) of the PMOS transistor P63 is connected to the inverting input terminal (−terminal), a source (first electrode) thereof is connected to the drain of the PMOS transistor P61, a drain (second electrode) thereof is connected to an output terminal OUT. A gate (control electrode) of the NMOS transistor N61 is connected to the control terminal DIS, a source (first electrode) thereof is connected to the ground voltage node to which the ground voltage GND is supplied, and a drain (second electrode) thereof is connected to the drain of the PMOS transistor P62. A gate (control electrode) and a drain (second electrode) of the NMOS transistor N62 are connected in common to each other, and a source (first electrode) thereof is connected to the ground voltage node. A gate (control electrode) of the NMOS transistor N63 is connected to the gate of the NMOS transistor N62, a source (first electrode) thereof is connected to the ground voltage node, and a drain (second electrode) thereof is connected to the output terminal OUT. The NMOS transistors N62 and N63 constitute a current mirror circuit wherein the NMOS transistor N62 is positioned at an input side of the current mirror circuit and the NMOS transistor N63 is positioned at an output side thereof. A common connection node between the drain of the PMOS transistor P62, the drain of the NMOS transistors N61 and the drain of the NMOS transistor N62 is defined as n1.

An operation of the switch circuit of the third embodiment is described next. There are a normal mode operation and a test mode operation in the operation of the switch circuit. The test control signal test goes "L" during the normal mode operation and "H" during the test mode operation. The "L" is a level of ground voltage GND and the "H" is a level of the power supply voltage VDD.

The normal mode operation is first described. The PMOS transistor P12 turns ON in response to the test control signal test of "L". The NMOS transistor N12 turns ON in response to the signal /test of "H". In such a manner, the input terminal 102 and the internal circuit 111 are forced into conduction.

The operational amplifier 501 outputs the signal out_501 having a high impedance (Hi-Z) in response to the signal /test of "H". The operational amplifier 502 outputs the output signal out_502 of "Hi-Z" in response to the signal /test of "H". Operations of the operational amplifiers 501 and 502 are described with reference to FIG. 6. The signal/test of "H" is inputted to the control terminal DIS. Since the signal of "H" is supplied to the gate of the PMOS transistor P61, the PMOS transistor P61 turns OFF. Since the signal of "H" is supplied to the gate of the NMOS transistor N61, the NMOS transistor N61 turns ON. A voltage of the node n1 becomes the ground voltage GND. Since the ground voltage GND is supplied to the gate of the NMOS transistor N63, the NMOS transistor N63 turns OFF. The output terminal OUT is interrupted from the power supply node and the ground voltage node, and it becomes "Hi-Z". A voltage of the output terminal OUT is not susceptible to voltages to the noninverting input terminal (+terminal) and the inverting input terminal (−terminal).

Since the input terminal 102 and the internal circuit 111 are forced into conduction and the output signal out_501 of the operational amplifier 501 becomes "Hi-Z", the input signal in to be supplied to the input terminal 102 is transmitted to the internal circuit 111. Even if there occurs an overshoot in the input signal in during the normal mode operation, and the input signal in is higher than the power supply voltage VDD, a signal having a voltage which is higher than the power supply voltage VDD is not transmitted to the internal circuit 112. Even if there occurs an undershoot in the input signal in during the normal mode operation, and the normal input signal in is lower than the ground voltage GND, a signal having a voltage which is lower than the ground voltage GND is not transmitted to the internal circuit 112. Since the output signal out_502 of the operational amplifier 502 goes "Hi-Z", the input signal in to be supplied to the input terminal 102 is not susceptible to the internal circuit 112 during the normal mode operation.

The test mode operation is described next. The PMOS transistor P12 turns OFF in response to the test control signal test of "H". The NMOS transistor N12 turns OFF in response to the signal /test of "L". In such a manner, the connection between the input terminal 102 and the internal circuit 111 is interrupted. The input signal in is transmitted to the internal circuit 112. Operations of the operational amplifiers 501 and 502 are now described with reference to FIG. 6. The PMOS transistor P61 turns ON in response to the signal /test of "L". The NMOS transistor N61 turns OFF in response to the signal /test of "L". A current flows from the power supply node to the ground voltage node via the PMOS transistor P61 and P62 and the NMOS transistor N62. Since the NMOS transistors N62 and N63 constitute the current mirror circuit, a current having the same amount of the current flowing to the NMOS transistor N62 flows from the power supply node to the ground voltage node via the PMOS transistor P63 and the NMOS transistor N63. In such a manner, a voltage of the gate of the PMOS transistor, i.e. a voltage of the inverting input terminal (−terminal) is equal to the voltage of the noninverting terminal (+terminal). With the operations set forth above, the input signal in supplied to the input terminal 102 is transmitted to the internal circuit 112.

As mentioned above, the switch circuit of the third embodiment includes the operational amplifier 501 which is connected between the input terminal 102 and the internal circuit 112 and operates in response to the test control signal test, so that even if there occurred the overshoot or the undershoot in the input signal in to be supplied to the input terminal 102 during the normal mode operation, it is possible to prevent a signal having the voltage which is higher than the power supply voltage VDD or a signal having the voltage which is lower than the ground voltage GND from being transmitted to the internal circuit 112. The switch circuit of the third embodiment can prevent the internal circuit 112 from being susceptible to a noise generated in the input signal in.

Fourth Preferred Embodiment

Figure 7:
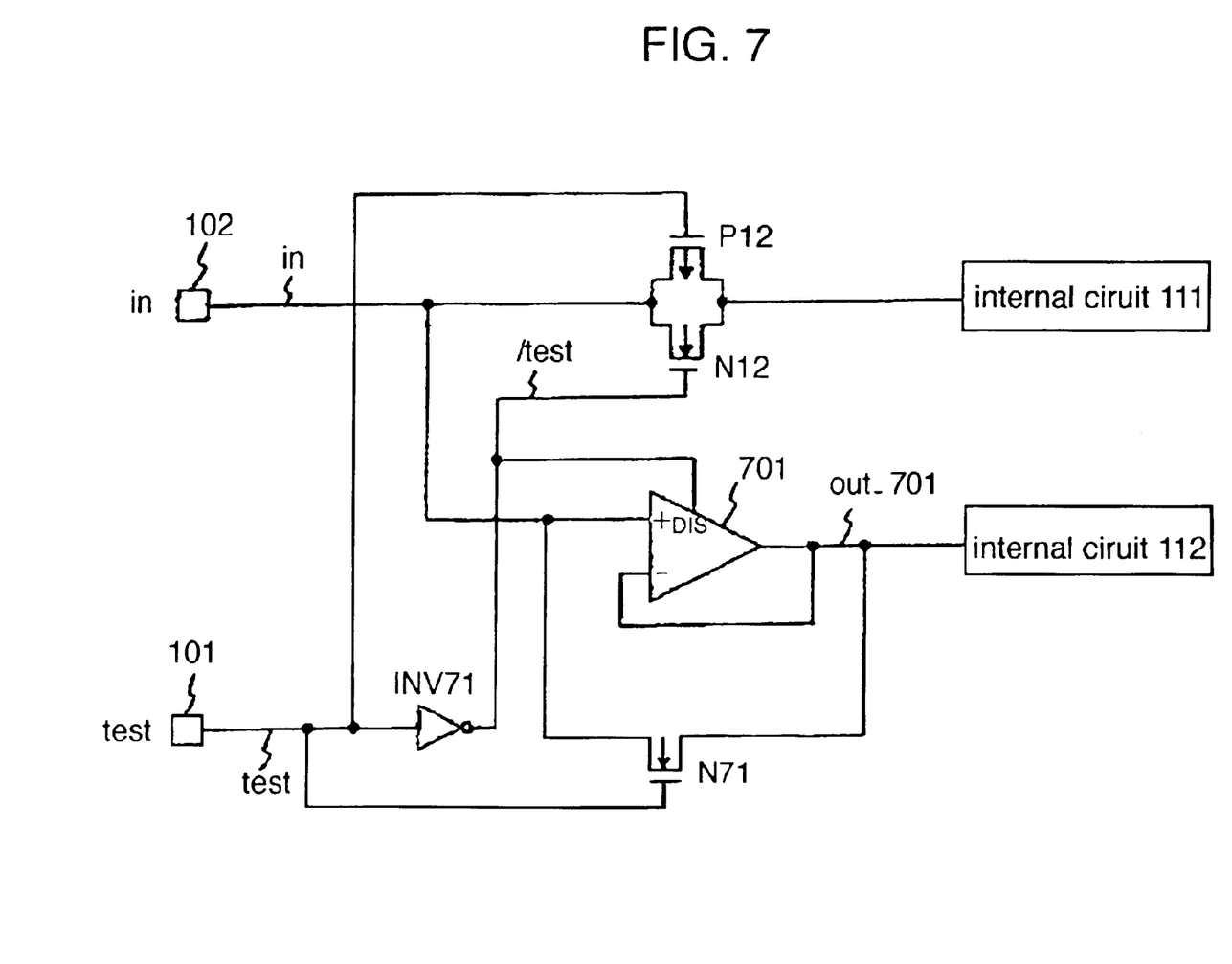
FIG. 7 is a circuit diagram showing a configuration of a switch circuit according to a fourth embodiment of the invention.

A switch circuit of a fourth embodiment of the invention is described. FIG. 7 is a circuit diagram showing a configuration of a switch circuit according to the fourth embodiment of the invention. The switch circuit of the fourth embodiment comprises an inverter circuit INV71 for outputting a signal /test having a phase opposite to that of a test control signal test in response to the test control signal test, an NMOS transistor N71 which operates in response to the test control signal test, an operational amplifier 701 which is controlled in an operative condition in response to the signal /test and outputs an output signal out_701 in response to an input signal in, a PMOS transistor P12 which operates in response to the test control signal test, and an NMOS transistor N12 which operates in response to the signal /test. The signal and a wiring for transmitting the signal are depicted by the same reference numeral.

An input terminal of the inverter circuit INV71 is connected to a test terminal 101 via a test control signal line test, and an output terminal thereof is connected to the operational amplifier 701 and the NMOS transistor N12. A gate (control electrode) of the NMOS transistor N71 is connected to the test terminal 101 via the test control signal line test, a first electrode thereof is connected to an input terminal 102 via an input signal line in, and a second electrode thereof is connected to an internal circuit 112. The internal circuit 112 is a circuit which is susceptible to a noise generated in a signal to be inputted thereto, e.g., an analog circuit. A noninverting input terminal (+terminal) of the operational amplifier 701 is connected to the input terminal 102 via the input signal line in, and an inverting input terminal (−terminal) and an output terminal thereof are connected in common to each other, and a common connection node thereof is connected to the internal circuit 112, and a control terminal DIS thereof is connected to the output terminal of the inverter circuit INV71 via the signal line /test. The configuration of the operational amplifier 701 is the same as that of the circuit of the operational amplifier shown in FIG. 6. A gate of the PMOS transistor P12 is connected to the test terminal 101 via the test signal line test, a first electrode thereof is connected to the input terminal 102 via the input signal line in, and a second electrode thereof is connected to the internal circuit 111. A gate of the NMOS transistor N12 is connected to an output terminal of the inverter circuit INV71 via the signal line /test, a first electrode thereof is connected to the input terminal 102 via the input signal line in, and a second electrode thereof is connected to the internal circuit 111. The first electrode of the NMOS transistor N12 and the first electrode of the PMOS transistor P12 are connected in common to each other. The second electrode of the NMOS transistor N12 and the second electrode of the PMOS transistor P12 are connected in common to each other. The internal circuit 111 is a circuit which is hardly susceptible to the noise generated in a signal to be inputted thereto, e.g., a digital circuit.

An operation of the switch circuit of the fourth embodiment is described next. There are a normal mode operation and a test mode operation in the operation of the switch circuit. The test control signal test goes "L" during the normal mode operation and "H" during the test mode operation. The "L" is a level of ground voltage GND and the "H" is a level of the power supply voltage VDD.

The normal mode operation is first described. The PMOS transistor P12 turns ON in response to the test control signal test of "L". The NMOS transistor N12 turns ON in response to the signal /test of "H". In such a manner, the input terminal 102 and the internal circuit 111 are forced into conduction. The NMOS transistor N71 turns OFF in response to the test control signal test of "L". The operational amplifier 701 outputs an output signal out_701 of "Hi-Z" in response to the signal /test of "H". The voltage of the output signal out_701 is not susceptible to the voltage of the input signal in. Even if there occurred the overshoot in the input signal in during the normal mode operation so that the voltage of the input signal in was higher than the power supply voltage VDD, an npn-type parasitic bipolar transistor formed in the NMOS transistor N71 turns OFF. Accordingly, even if there occurred the overshoot in the input signal in during the normal mode operation, so that the voltage of the input signal in was higher than the power supply voltage VDD, a signal having a voltage which is higher than the power supply voltage VDD is not transmitted to the internal circuit 112.

The test mode operation is described next. The PMOS transistor P12 turns OFF in response to the test control signal test of "H". The NMOS transistor N12 turns OFF in response to the signal /test of "L". In such a manner, the connection between the input terminal 102 and the internal circuit 111 is interrupted. The NMOS transistor N71 turns ON in response to test control signal test of "H" to transmit the input signal in to the internal circuit 112. The operational amplifier 701 is active in response to the signal /test of "L" to output the output signal out_701 having the same level of the input signal in.

Described next is an operation in the case where there occurs an overshoot in the input signal in during the test mode operation. Since the power supply voltage VDD is supplied to the gate of the NMOS transistor N71 and a voltage which is higher than the power supply voltage VDD is supplied to the first electrode thereof, the voltage of the second electrode of the NMOS transistor N71 becomes "power supply voltage VDD−Vtn", where Vtn is a threshold voltage of the NMOS transistor N71.

As mentioned above, the switch circuit of the fourth embodiment includes the operational amplifier 701 which is connected between the input terminal 102 and the internal circuit 112 and operates in response to the test control signal test and the NMOS transistor N71 which is connected between the input terminal 102 and the internal circuit 112 and operates in response to the test control signal test, so that even if there occurred the overshoot or the undershoot in the input signal in during the normal node operation, it is possible to prevent the signal from being transmitted to the internal circuit 112. Further, the switch circuit of the fourth embodiment comprises the operational amplifier 701 which is connected between the input terminal 102 and the internal circuit 112 and operates in response to the test control signal test, and the NMOS transistor N71 which is connected between the input terminal 102 and the internal circuit 112 and operates in response to the test control signal test so that even if there occurred the overshoot in the input signal in during the test mode operation, the input signal in can be prevented from being transmitted to the internal circuit 112. The switch circuit of the fourth embodiment can prevent the internal circuit 112 from being susceptible to the noise generated in the input signal in.

Fifth Preferred Embodiment

Figure 8:
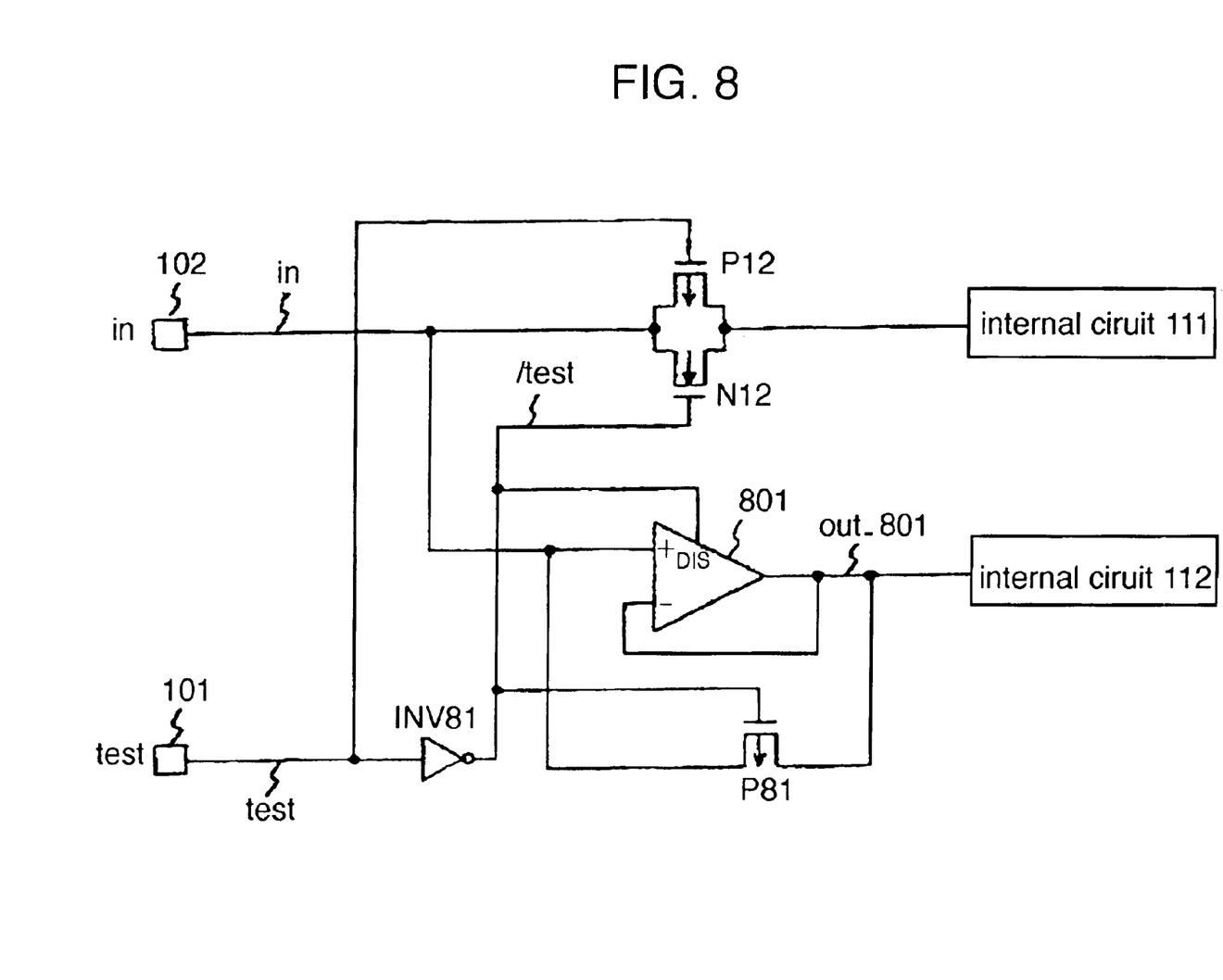
FIG. 8 is a circuit diagram showing a configuration of a switch circuit according to a fifth embodiment of the invention.

A switch circuit of a fifth embodiment of the invention is described. FIG. 8 is a circuit diagram showing a configuration of a switch circuit according to the fifth embodiment of the invention. The switch circuit of the fifth embodiment comprises an inverter circuit INV81 for outputting a signal /test having a phase opposite to that of a test control signal test in response to the test control signal test, a PMOS transistor P81 which operates in response to the signal /test, an operational amplifier 801 which outputs an output signal out_801 in response to an input signal in, a PMOS transistor P12 which operates in response to the test control signal test, and an NMOS transistor N12 which operates in response to the signal /test. The signal and a wiring for transmitting the signal are depicted by the same reference numeral.

An input terminal of the inverter circuit INV81 is connected to a test terminal 101 via a test control signal line test, and an output terminal thereof is connected to the operational amplifier 801 and the NMOS transistor N12. A gate (control electrode) of the PMOS transistor P81 is connected to the signal /test via the signal line /test, a first electrode thereof is connected to an input terminal 102 via the input signal line in, and a second electrode thereof is connected to an internal circuit 112. The internal circuit 112 is a circuit which is susceptible to a noise generated in a signal to be inputted thereto, e.g., an analog circuit. A noninverting input terminal (+terminal) of the operational amplifier 801 is connected to the input terminal 102 via the input signal line in, and an inverting input terminal (−terminal) thereof and an output terminal thereof are connected in common to each other, and a common connection node thereof is connected to the internal circuit 112, and a control terminal DIS thereof is connected to the output terminal of the inverter circuit INV81 via the signal line /test. The configuration of the operational amplifier 801 is the same as that of the circuit of the operational amplifier shown in FIG. 6. A gate of the PMOS transistor P12 is connected to the test terminal 101 via the test signal line test, the first electrode thereof is connected to the input terminal 102 via the input signal line in, and a second electrode thereof is connected to the internal circuit 111. A gate of the NMOS transistor N12 is connected to an output terminal of the inverter circuit INV51 via the signal line /test, a first electrode thereof is connected to the input terminal 102 via input signal line in, and a second electrode thereof is connected to the internal circuit 111. The first electrode of the NMOS transistor N12 and the first electrode of the PMOS transistor P12 are connected in common to each other. The second electrode of the NMOS transistor N12 and the second electrode of the PMOS transistor P12 are connected in common to each other. The internal circuit 111 is a circuit which is hardly susceptible to the noise generated in a signal to be inputted thereto, e.g., a digital circuit.

An operation of the switch circuit of the fifth embodiment is described next. There are a normal mode operation and a test mode operation in the operation of the switch circuit. The test control signal test goes "L" during the normal mode operation and "H" during the test mode operation. The "L" is a level of ground voltage GND and the "H" is a level of the power supply voltage VDD.

The normal mode operation is first described. The PMOS transistor P12 turns ON in response to the test control signal test of "L". The NMOS transistor N12 turns ON in response to the signal /test of "H". In such a manner, the input terminal 102 and the internal circuit 111 are forced into conduction. The PMOS transistor P81 turns OFF in response to the signal /test of "H". The operational amplifier 801 outputs an output signal out_801 of "Hi-Z" in response to the signal /test of "H". The voltage of the output signal out_801 is not susceptible to the voltage of the input signal in. Even if there occurred the undershoot in the input signal in during the normal mode operation so that the voltage of the input signal in was lower than the ground voltage GND, a pnp-type bipolar transistor formed in the PMOS transistor P81 turns OFF. Accordingly, even if there occurred the undershoot in the input signal in during the normal mode operation so that the voltage of the input signal in was lower than the ground voltage GND, a signal having a voltage which is lower than the ground voltage GND is not transmitted to the internal circuit 112.

The test mode operation is described next. The PMOS transistor P12 turns OFF in response to the test control signal test of "H". The NMOS transistor N12 turns OFF in response to the signal /test of "L". In such a manner, the connection between the input terminal 102 and the internal circuit 111 is interrupted. The PMOS transistor P71 turns ON in response to the signal /test of "L" to transmit the input signal in to the internal circuit 112. The operational amplifier 801 is active in response to the signal /test of "L" to output the output signal out_801 having the same level of the input signal in.

Described next is an operation in the case where there occurs the undershoot in the input signal in during the test mode operation. Since the ground voltage GND is supplied to the gate of the PMOS transistor P81 and a voltage which is lower than the ground voltage GND is supplied to the first electrode thereof the voltage of the second electrode of the PMOS transistor P81 becomes "Vtp", where Vtp is a threshold voltage of the PMOS transistor P81. As mentioned above, the switch circuit of the fifth embodiment includes the operational amplifier 801 which is connected between the input terminal 102 and the internal circuit 112 and operates in response to the test control signal test and the PMOS transistor P81 which is connected between the input terminal 102 and the internal circuit 112 and operates in response to the test control signal test, so that even if there occurred the undershoot in the input signal in, it is possible to prevent the signal from being transmitted to the internal circuit 112. The switch circuit of the fifth embodiment can prevent the internal circuit 112 from being susceptible to a noise generated in the input signal in.

Sixth Preferred Embodiment

Figure 9:
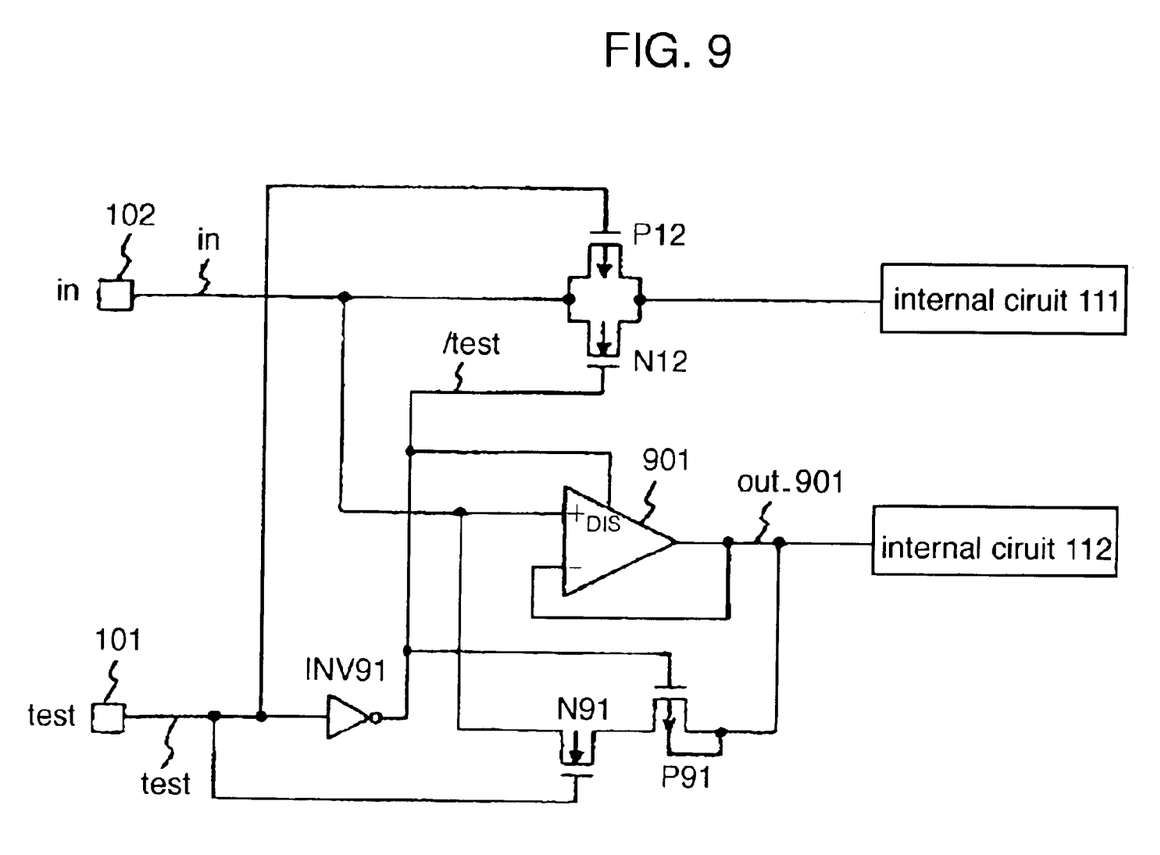
FIG. 9 is a circuit diagram showing a configuration of a switch circuit according to a sixth embodiment of the invention

A switch circuit of a sixth embodiment of the invention is described. FIG. 9 is a circuit diagram showing a configuration of a switch circuit according to the sixth embodiment of the invention. The switch circuit of the sixth embodiment comprises an inverter circuit INV91 for outputting a signal /test having a phase opposite to that of a test control signal test in response to the test control signal test, an operational amplifier 901 which is controlled in an operative condition in response to the signal /test and outputs an output signal out_901 in response to an input signal in, an NMOS transistor N91 and a PMOS transistor P12 which operate in response to the test control signal test, and a PMOS transistor P91 and an NMOS transistor N12 which operate in response to the signal /test. An input terminal of the inverter circuit INV91 is connected to a test terminal 101 via a test control signal line test, and an output terminal thereof is connected to the operational amplifier 901, the PMOS transistor P91 and the NMOS transistor N12 via the signal line /test A noninverting input terminal (+terminal) of the operational amplifier 901 is connected to an input terminal 102 via an input signal line in, and an inverting input terminal (−terminal) and an output terminal thereof are connected in common to each other, and a common connection node thereof is connected to an internal circuit 112, and a control terminal DIS thereof is connected to the output terminal of the inverter circuit INV91 via the signal line /test. The configuration of the operational amplifier 901 is the same as that of the operational amplifier shown in FIG. 6. The internal circuit 112 is a circuit which is susceptible to a noise generated in a signal to be inputted thereto, e.g., an analog circuit. A gate (control electrode) of the NMOS transistor N91 is connected to the test terminal 101 via the test signal line test, a first electrode thereof is connected to an input terminal 102 via the input signal line in, and a second electrode thereof is connected to the PMOS transistor P91. A gate (control electrode) of the PMOS transistor P91 is connected to an output terminal of the inverter circuit INV91 via the signal line /test, a first electrode thereof is connected to the second electrode of the NMOS transistor N91, a second electrode thereof is connected to the internal circuit 112 and a substrate thereof is connected to the second electrode thereof. A gate (control electrode) of the PMOS transistor P12 is connected to a test terminal via the test control signal test, a first electrode thereof is connected to the input terminal 102 via the input signal line in and a second electrode thereof is connected to the internal circuit 111. A gate (control electrode) of the NMOS transistor N12 is connected to the output terminal of the inverter circuit INV91 via the signal line /test, a first electrode thereof is connected to the input terminal 102 via the input signal line in and a second electrode thereof is connected to the internal circuit 111. The first electrode of the PMOS transistor P12 and the first electrode of the NMOS transistor N12 are connected in common to each other, while the second electrode of the PMOS transistor P12 and the second electrode of the NMOS transistor N12 are connected in common to each other. The internal circuit 111 is a circuit which is hardly susceptible to the noise generated in a signal to be inputted thereto, e.g., a digital circuit.

An operation of the switch circuit of the sixth embodiment is described next. There are a normal mode operation and a test mode operation in the operation of the switch circuit. The test control signal test goes "L" during the normal mode operation and "H" during the test mode operation. The "L" is a level of ground voltage GND and the "H" is a level of the power supply voltage VDD.

The normal mode operation is first described. The PMOS transistor P12 turns ON in response to the test control signal test of "L". The NMOS transistor N12 turns ON in response to the signal /test of "H". In such a manner, the input terminal 102 and the internal circuit 111 are forced into conduction. The NMOS transistor N91 turns OFF in response to the test control signal test of "L". The PMOS transistor P91 turns OFF in response to the signal /test of "H". The operational amplifier 901 is inactive in response to the signal /test of "H", and outputs an output signal out_901 of "Hi-Z". In such a manner, the connection between the input terminal 102 and the internal circuit 112 is interrupted.

Described next is an operation in the case where there occurs an overshoot in the input signal in during the normal mode operation. When there occurs the overshoot in the input signal in and the voltage of the input signal in is higher than the power supply voltage VDD, the operational amplifier 901 outputs the output signal out_901 of "Hi-Z" regardless of the voltage of the input signal in. At this time, an npn-type parasitic bipolar transistor formed in the NMOS transistor N91 turns OFF. In such a manner, the connection between the input terminal 102 and the internal circuit 112 is interrupted, and the input signal in having the voltage higher than the power supply voltage VDD is not transmitted to the internal circuit 112.

Described next is an operation in the case where there occurs an undershoot in the input signal in. When there occurs the undershoot in the input signal in and the voltage of the input signal in is lower than the ground voltage GND, the operational amplifier 901 outputs the output signal out_901 of "Hi-Z" regardless of the voltage of the input signal in. At this time, a pnp-type parasitic bipolar transistor formed in the PMOS transistor P91 turns OFF. In such a manner, the connection between the input terminal 102 and the internal circuit 112 is interrupted, and the input signal in having the voltage lower than the ground voltage GND is not transmitted to the internal circuit 112.

The test mode operation is described next. The PMOS transistor P12 turns OFF in response to the test control signal test of "H". The NMOS transistor N12 turns OFF in response to the signal /test of "L". In such a manner, the connection between the input terminal 102 and the internal circuit 111 is interrupted. The NMOS transistor N91 turns ON in response to the test control signal test of "H". The PMOS transistor P91 turns ON in response to the signal /test of "L". The operational amplifier 901 is active in response to the signal /test of "L" and outputs the output signal out_901 having the same level as the input signal in. In such a manner the input signal in is transmitted to the internal circuit 112.

Described next is an operation in the case where there occurs the overshoot in the input signal in during the test mode operation. Since the power supply voltage VDD is supplied to the gate of the NMOS transistor N91, and a voltage which is higher than the power supply voltage VDD is supplied to the first electrode thereof, the voltage of the second electrode of the NMOS transistor N91 becomes "the power supply voltage VDD−Vtn", where Vtn is a threshold voltage of the NMOS transistor N91. A signal of "the power supply voltage VDD−Vtn" is transmitted to the internal circuit 112.

Described next is an operation in the case where there occurs the undershoot in the input signal in. Since the ground voltage GND is supplied to the gate of the PMOS transistor P91 and a voltage which is lower than the ground voltage GND is supplied to the first electrode thereof the voltage of the second electrode of the PMOS transistor P91 becomes "Vtp", where Vtp is a threshold voltage of the PMOS transistor P91. The signal of Vtp is transmitted to the internal circuit 112.

As mentioned above, the switch circuit of the sixth embodiment includes the operational amplifier 901 which is connected between the input terminal 102 and the internal circuit 112 and operates in response to the test control signal test, and the NMOS transistor N91 and the PMOS transistor P91 which are connected between the input terminal 102 and the internal circuit 112 and operate in response to the test control signal test respectively, so that even if there occurred the overshoot or the undershoot in the input signal in, it is possible to prevent the signal from being transmitted to the internal circuit 112. The switch circuit of the sixth embodiment can prevent the internal circuit 112 from being susceptible to a noise generated in the input signal in.

As described in detail above, the switch circuit of the invention can prevent the noise from being transmitted to the internal circuit even if the noise was generated in the input signal, thereby preventing the internal circuit from being susceptible to the noise.

While the preferred form of the present invention has been described, it is to be understood that modifications will be apparent to those skilled in the art without departing from the spirit of the invention. The scope of the invention is to be determined solely by the following claims.

What is claimed is:

1. A switch circuit comprising:
   an input terminal which receives an input signal;
   an internal circuit which executes a predetermined function;
   a first MOS transistor of a first conductivity type which is coupled between the input terminal and the internal circuit, and which has a control gate receiving a control signal, a first electrode coupled to the input terminal, and a second electrode;
   a second MOS transistor of a second conductivity type that is opposite the first conductivity type, the second MOS transistor being coupled between the input terminal and the internal circuit, and having a control gate receiving a signal having a phase opposite the control signal, a first electrode coupled to the second electrode of the first MOS transistor, and a second electrode coupled to the internal circuit;
   another internal circuit which executes another predetermined function; and
   a switch element which is coupled between the input terminal and the another internal circuit, and which has a control gate receiving the control signal, a first electrode coupled to the input terminal, and a second electrode coupled to the another internal circuit,
   wherein the internal circuit is an analog circuit and the another internal circuit is a digital circuit.

2. The switch circuit according to claim 1, wherein the first MOS transistor is an n-type MOS transistor and the second MOS transistor is a p-type MOS transistor.

3. The switch circuit according to claim 2, wherein the second MOS transistor has a substrate terminal connected to the second electrode of the second MOS transistor.

4. The switch circuit according to claim 1, wherein the first MOS transistor is a p-type MOS transistor and the second MOS transistor is an n-type MOS transistor.

5. The switch circuit according to claim 4, wherein the first MOS transistor has a substrate terminal connected to the second electrode of the first MOS transistor.

6. A switch circuit comprising:
   an input terminal receiving an input signal;
   a first internal circuit having a first noise resistance capability;
   a second internal circuit having a second noise resistance capability that is weaker than the first noise resistance capability;
   a switching circuit connected between the input terminal and the first internal circuit, the switching circuit having a control terminal receiving a control signal;
   a first MOS transistor of a first conductivity type having a control gate receiving the control signal, a first electrode connected to the input terminal and a second electrode; and
   a second MOS transistor of a second conductivity type that is opposite the first conductivity type, the second MOS transistor having a control gate receiving an inverted signal having a phase opposite the control signal, a first electrode connected to the second electrode of the first MOS transistor and a second electrode connected to the second internal circuit.

7. The switch circuit according to claim 6, wherein the switching circuit is a transfer gate having a PMOS transistor and an NMOS transistor connected in parallel.

8. The switch circuit according to claim 6, wherein the control signal is a test signal.

9. The switch circuit according to claim 6, wherein the first internal circuit is a digital circuit and the second internal circuit is an analog circuit.

10. The switch circuit according to claim 6, wherein the control signal is input through another terminal.

11. The switch circuit according to claim 6, further comprising an inverter having an input terminal receiving the control signal and an output terminal outputting the inverted signal.

12. A switch circuit comprising:

an input terminal receiving an input signal;

a control input terminal receiving a control signal;

a first internal circuit having a first noise resistance capability;

a second internal circuit having a second noise resistance capability that is weaker than the first noise resistance capability;

a first switch circuit connected to the input terminal, the control input terminal and the first internal circuit, the first switch circuit passing the input signal to the first internal circuit responsive to the control signal; and a second switch circuit connected to the input terminal, the control input terminal and the second internal circuit, the second switch circuit passing the input signal to the second internal circuit responsive to the control signal, the second switch circuit including a first MOS transistor of a first conductivity type having a control gate receiving the control signal, a first electrode connected to the input terminal and a second electrode, and a second MOS transistor of a second conductivity type that is opposite the first conductivity type, the second MOS transistor having a control gate receiving an inverted signal having a phase opposite the control signal, a first electrode connected to the second electrode of the first MOS transistor and a second electrode connected to the second internal circuit.

13. The switch circuit according to claim 12, wherein the first switch circuit is a transfer gate having a PMOS transistor and an NMOS transistor connected in parallel.

14. The switch circuit according to claim 12, wherein the control signal is a test signal.

15. The switch circuit according to claim 12, wherein the first internal circuit is a digital circuit and the second internal circuit is an analog circuit.

16. The switch circuit according to claim 12, further comprising an inverter having an input terminal receiving the control signal and an output terminal outputting the inverted signal.

* * * * *